United States Patent
Lee

(10) Patent No.: US 7,732,246 B2
(45) Date of Patent: Jun. 8, 2010

(54) METHOD FOR FABRICATING VERTICAL CMOS IMAGE SENSOR

(75) Inventor: Sang Gi Lee, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 997 days.

(21) Appl. No.: 11/296,234

(22) Filed: Dec. 6, 2005

(65) Prior Publication Data

US 2006/0138531 A1 Jun. 29, 2006

(30) Foreign Application Priority Data

Dec. 29, 2004 (KR) .................. 10-2004-0114603

(51) Int. Cl.
*H01L 21/00* (2006.01)
*H01L 21/265* (2006.01)
(52) U.S. Cl. ................ 438/74; 438/268; 438/521; 257/E21.61; 257/E21.643
(58) Field of Classification Search ............. 438/514, 438/521, 48, 57, 73, 74, 268, FOR. 310, FOR. 426, 438/FOR. 416; 257/E27.133, E21.361, E21.643
See application file for complete search history.

(56) References Cited

U.S. PATENT DOCUMENTS

| | | | | |
|---|---|---|---|---|
| 4,239,554 A | * | 12/1980 | Yamazaki | .......... 136/255 |
| 4,722,910 A | | 2/1988 | Yasaitis | |
| 5,162,887 A | * | 11/1992 | Dierschke | .......... 257/465 |
| 5,494,857 A | | 2/1996 | Cooperman et al. | |
| 6,055,460 A | | 4/2000 | Shopbell | |
| 6,110,788 A | * | 8/2000 | Violette et al. | .......... 438/301 |
| 6,128,091 A | | 10/2000 | Uchida et al. | |

(Continued)

FOREIGN PATENT DOCUMENTS

JP    6-132505 A    5/1994

(Continued)

OTHER PUBLICATIONS

Sang Slk Kim, Seong Gyun Kim, and No Seok Yang; CCD Image Sensor and Method for Manufacturing the Same: Korean Patent Abstracts; Publication Date: Sep. 16, 1998; 2 Pages: Publication No. 100165376 B1; Korean Intellectual Property Office, Republic of Korea.

(Continued)

*Primary Examiner*—Matthew Smith
*Assistant Examiner*—Quovaunda Jefferson
(74) *Attorney, Agent, or Firm*—The Law Offices of Andrew D. Fortney; Andrew D. Fortney; William K. Nelson

(57) ABSTRACT

A method of fabricating a vertical CMOS image sensor is disclosed, to improve the integration with the decrease in size of pixel by minimizing the lateral diffusion, in which phosphorous and arsenic ions are implanted while controlling the dose and energy, the method including forming a first photodiode in a semiconductor substrate; forming a first epitaxial layer on the semiconductor substrate; forming a first plug by sequentially implanting first and second ions in the first epitaxial layer; forming a second photodiode in the first epitaxial layer; forming a second epitaxial layer in the first epitaxial layer; forming an isolation area in the second epitaxial layer; and forming a third photodiode and a second plug in the second epitaxial layer.

29 Claims, 5 Drawing Sheets

U.S. PATENT DOCUMENTS

| | | | |
|---|---|---|---|
| 6,187,684 B1 | 2/2001 | Farber | |
| 6,194,770 B1 | 2/2001 | Zarnowski et al. | |
| 6,379,992 B2 | 4/2002 | Jo | |
| 6,414,343 B1 | 7/2002 | Kondo et al. | |
| 6,580,109 B1 * | 6/2003 | Thomas et al. | 257/292 |
| 6,646,318 B1 * | 11/2003 | Hopper et al. | 257/440 |
| 6,746,933 B1 | 6/2004 | Beintner et al. | |
| 6,875,558 B1 | 4/2005 | Gaillard et al. | |
| 6,949,424 B2 * | 9/2005 | Springer | 438/202 |
| 7,132,724 B1 * | 11/2006 | Merrill | 257/440 |
| 7,279,353 B2 | 10/2007 | Rhodes | |
| 7,419,844 B2 * | 9/2008 | Lee et al. | 438/48 |
| 7,423,307 B2 | 9/2008 | Lee | |
| 2002/0058353 A1 * | 5/2002 | Merrill | 438/57 |
| 2006/0056034 A1 | 3/2006 | Tsuruma | |
| 2006/0073623 A1 | 4/2006 | Conley, Jr. et al. | |
| 2006/0086957 A1 | 4/2006 | Kang | |
| 2006/0138494 A1 | 6/2006 | Lee | |
| 2006/0145224 A1 | 7/2006 | Lee | |
| 2008/0142857 A1 * | 6/2008 | Park | 257/292 |
| 2008/0303073 A1 | 12/2008 | Lee | |

FOREIGN PATENT DOCUMENTS

| | | |
|---|---|---|
| JP | 8-148665 A | 6/1996 |
| JP | 9-222505 A | 8/1997 |
| JP | 2001-068658 | 3/2001 |
| JP | 2004-172335 A | 6/2004 |
| JP | 2004-356270 A | 12/2004 |
| KR | 0165376 | 9/1998 |

OTHER PUBLICATIONS

Stanley Wolf Ph.D.; Chapter 2, Isolation Technologies for Integrated Circuits; Silicon Processing for the VLSI ERA, vol. 2: Process Integration; Copyright 1990; Lattice Press, Sunset Beach, CA.

Tomohiko Otani; "Device Having Microlens and Shape of Microlens"; Patent Abstracts of Japan; Publication No. 09-222505; Publication Date: Aug. 26, 1997; Japanese Patent Office; Japan.

Takashi Nakano and Shinichi Teranishi; "Solid Image Pickup Element"; Patent Abstracts of Japan; Publication No. 08-148665; Publication Date: Jun. 7, 1996; Japanese Patent Office; Japan.

Koichi Harada, Yasuhiro Ueda, Nobuhiko Umetsu, Kazuji Wada, Yoshitetsu Toumiya and Takeshi Matsuda; "Solid State Image Sensor and Fabrication Thereof"; Publication No. JP2001068658A; Publication Date: Mar. 16, 2001; Japanese Patent Office; Japan.

Koichiro Okumura and Sakae Hashimoto; "Optoelectric Transducer and Its Manufacturing Method"; Patent Abstracts of Japan; Publication No. 2004-356270; Publication Date: Dec. 16, 2004; Japan Patent Office, Japan.

Tadakuni Narabe; "Solid-State Imaging Apparatus"; Patent Abstracts of Japan; Publication No. 2004-172335; Publication Date: Jun. 17, 2004; Japan Patent Office, Japan.

Masanori Ohashi; "Solid-State Image Sensing Element and Manufacture Thereof"; Patent Abstracts of Japan; Publication No. 06-132505; Publication Date: May 13, 1994; Japan Patent Office, Japan.

* cited by examiner

METHOD FOR FABRICATING VERTICAL CMOS IMAGE SENSOR

This application claims the benefit of Korean Patent Application No. P2004-114603, filed on Dec. 29, 2004, which is hereby incorporated by reference as if fully set forth herein.

BACKGROUND OF THE INVENTION

1. Field of the Invention

The present invention relates to a method for fabricating a vertical CMOS image sensor, and more particularly, to a method for fabricating a vertical CMOS image sensor that reduces or minimizes the lateral diffusion in an (implant) plug by controlling the kind (or element), dose and energy of ion implantation.

2. Discussion of the Related Art

Generally, an image sensor is a semiconductor device for converting an optical image to an electric signal. Image sensors may be classified into charge-coupled devices (CCDs) and CMOS image sensors. In the case of the CCD, metal-oxide-silicon MOS capacitors are positioned adjacent to one another, and electric carriers are stored in and transferred from the MOS capacitors. In the CMOS image sensor, the number of MOS transistors generally corresponds to the number of pixels. CMOS technology is generally used to form a control circuit and a signal processing circuit as peripheral circuits, whereby output signals are sequentially output using the MOS transistors.

In a vertical CMOS image sensor according to the related art, a plug having a depth of about 2 μm (which may be used, e.g., to sense a signal of a red photodiode) is typically formed by implanting phosphorous at a high energy and dose. At sufficiently high doses, there may be relatively severe lateral diffusion. Thus, the isolation characteristics between adjacent photodiodes may deteriorate.

Hereinafter, a method for fabricating a vertical CMOS image sensor according to the related art will be described as follows.

FIG. 1 is a cross sectional diagram showing a method for fabricating a vertical CMOS image sensor according to the related art.

As shown in FIG. 1, a red photodiode 11 is formed in a first epitaxial layer (not shown), and a second epitaxial layer 12 is grown thereon to a thickness of about 2 μm. Then, a first photoresist pattern (not shown) is formed on the second epitaxial layer 12, wherein the first photoresist pattern (not shown) has an open portion for a plug. For electrical connection with the red photodiode 11, phosphorous ions are implanted into the second epitaxial layer 12 at a high energy (e.g., of 1200 KeV) to form plug 13 and at a medium energy (e.g., of 500 KeV) with the first photoresist pattern as a mask. After removing the first photoresist pattern, a second photoresist pattern (not shown) is formed on the second epitaxial layer 12. Then, a green photodiode 14 is formed in the second epitaxial layer 12 by ion implantation, and the second photoresist pattern is removed.

Next, a third epitaxial layer 15 is formed on the second epitaxial layer 12 including the green photodiode 14, and an STI (Shallow Trench Isolation) layer 16 is formed in the third epitaxial layer 15. Then, a third photoresist pattern (not shown) is formed on the third epitaxial layer 15, and a second plug 17 is formed in the third epitaxial layer 15 by ion implantation.

Also, a fourth photoresist pattern (not shown) is formed on the third epitaxial layer 15 including the STI layer 16, and a blue photodiode 18 is formed by ion implantation.

In the aforementioned vertical CMOS image sensor according to the related art, the isolation characteristics between adjacent photodiodes may deteriorate due to the lateral diffusion of the first plug. Accordingly, it can be difficult to decrease the size of unit pixel due to the deterioration of the isolation characteristics.

The method for fabricating the vertical CMOS image sensor according to the related art has the following disadvantages.

Where an implant plug may be formed at a depth of about 2 μm (e.g., to sense the signal of the red photodiode 11), the lateral diffusion may be severe due to the phosphorous implant of high dose (and perhaps to some extent, high dose in combination with high energy). Thus, it may have a limitation with regard to decreasing the size of the unit pixel due to the potential deterioration of the isolation characteristics. As a result, it can be difficult to obtain (or realize the potential for) high integration of the vertical CMOS image sensor, and thus decrease the production cost.

SUMMARY OF THE INVENTION

Accordingly, the present invention is directed to a method for fabricating a vertical CMOS image sensor that substantially obviates one or more problems due to limitations and disadvantages of the related art.

An object of the present invention is to provide a method for fabricating a vertical CMOS image sensor (which generally improves integration and decreases the size of the unit pixel by minimizing the lateral diffusion of a plug implant), in which phosphorous and arsenic ions are implanted at a controlled dose and energy.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating a vertical CMOS image sensor includes forming a first photodiode in a semiconductor substrate; forming a first epitaxial layer on the semiconductor substrate including the first photodiode; forming a first plug by sequentially implanting first and second ions in the first epitaxial layer; forming a second photodiode in the first epitaxial layer; forming a second epitaxial layer on the first epitaxial layer including the second photodiode; forming an isolation area in the second epitaxial layer; and forming a third photodiode and a second plug in the second epitaxial layer.

At this time, the process of forming the first plug may include forming a photoresist pattern defining an area of the first plug in the first epitaxial layer; implanting phosphorous ions at an energy of 1500 KeV, arsenic ions at an energy of 1200 KeV, and arsenic ions at an energy of 500 KeV through the photoresist pattern.

Also, the phosphorous ions may be implanted at a low dose, and the arsenic ions at a high dose.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a method for fabricating a vertical CMOS image sensor according to the present invention will be described with reference to the accompanying drawings.

FIGS. 2 to 5 illustrate cross sectional views of a method for fabricating a vertical CMOS image sensor according to the present invention.

Figure 2:
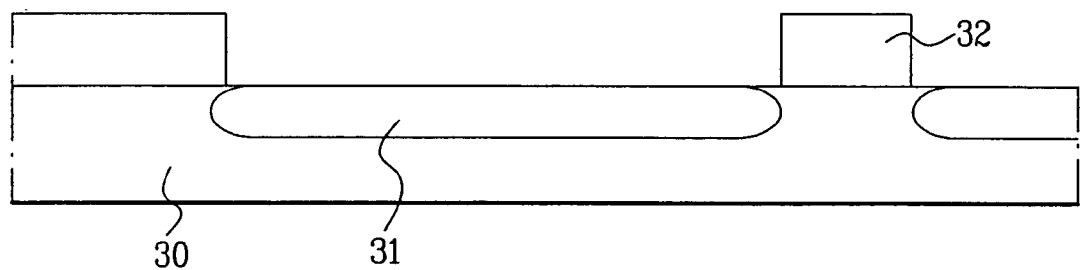
FIGS. 2 to 5 illustrate cross sectional views of a method for fabricating a vertical CMOS image sensor according to the present invention.

Referring to FIG. 2, a first epitaxial layer may be grown (typically by conventional epitaxial growth of silicon or silicon-germanium) on a semiconductor substrate 30, and a first photoresist is coated on the semiconductor substrate 30 including the first epitaxial layer. (Alternatively, a single crystal silicon substrate having certain predetermined qualities or characteristics, perhaps similar to such an epitaxial layer, may be used without first forming an epitaxial layer.) Then, a first photoresist pattern 32 is formed on the semiconductor substrate 30 by conventional photolithography and development, wherein the first photoresist pattern 32 provides an opening in a predetermined portion or area of the substrate or epitaxial layer corresponding to a red photodiode. After that, a red photodiode 31 is generally formed by ion implantation (e.g., a conventional dose of a conventional dopant for such a photodiode at an energy appropriate for formation of such a photodiode, such as a relatively low energy as described herein), and the first photoresist pattern 32 is removed.

Figure 3:
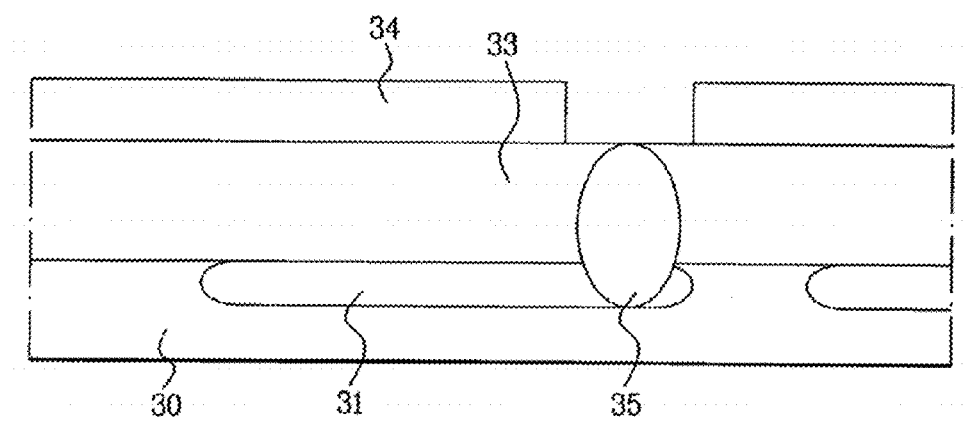

As shown in FIG. 3, a second epitaxial layer 33 is formed (typically by conventional epitaxial growth of silicon or silicon-germanium) at a thickness of about 2 μm on the semiconductor substrate 30 including the red photodiode 31. Then, a second photoresist is coated on the second epitaxial layer 33. After that, a second photoresist pattern 34 is formed on the semiconductor substrate 30 by conventional photolithography and development, wherein the first photoresist pattern 34 provides an opening to a predetermined portion or area of the epitaxial layer 33 corresponding to a first plug (which provides an electrical connection with the red photodiode 31). A first plug 35 is formed in the predetermined portion of the second epitaxial layer 33 corresponding to the opening by implanting impurity ions using the second photoresist pattern 34 as a mask.

Hereinafter, a method for fabricating the first plug according to the first and second embodiments of the present invention will be described in detail.

In accordance with the first embodiment of the present invention, a low dose of phosphorous ions (e.g., from about $5 \times 10^{12}$ to about $1 \times 10^{13}$ atoms/cm$^2$) are implanted at a relatively high energy (e.g., from about 1000 keV to about 2000 keV, preferably from about 1200 keV to about 1800 keV, and in one embodiment, of about 1500 keV) using the second photoresist pattern 34 as a mask. And then a dose of arsenic ions (e.g., from about $5 \times 10^{12}$ to about $5 \times 10^{13}$ atoms/cm$^2$, preferably about $7 \times 10^{12}$ to about $8 \times 10^{12}$ atoms/cm$^2$) may be implanted at a high energy (e.g., from about 1000 keV to about 1500 keV, and in one embodiment, of about 1200 KeV) using the second photoresist pattern 34 as a mask, thereby forming the first plug 35.

In accordance with the second embodiment of the present invention, a low dose of phosphorous ions (e.g., from about $5 \times 10^{12}$ to about $1 \times 10^{13}$ atoms/cm$^2$) are implanted at a relatively high energy (e.g., from about 1000 keV to about 2000 keV, preferably from about 1200 keV to about 1800 keV, and in one embodiment, of about 1500 keV) using the second photoresist pattern 34 as a mask. A dose of arsenic ions (e.g., from about $7 \times 10^{12}$ to about $8 \times 10^{12}$ atoms/cm$^2$) may be implanted at a high energy (e.g., from about 1000 keV to about 1500 keV, and in one embodiment, of about 1200 KeV). And then, A dose of arsenic ions (e.g., from about $7 \times 10^{12}$ to about $8 \times 10^{12}$ atoms/cm$^2$) may be implanted at a relatively low energy of (e.g., from about 300 keV to about 1000 keV, preferably from about 400 keV to about 800 keV, and in one embodiment, about 500 KeV), thereby forming the first plug 35. In the first and second embodiments, the order of ion implantation is changeable.

Figure 1:
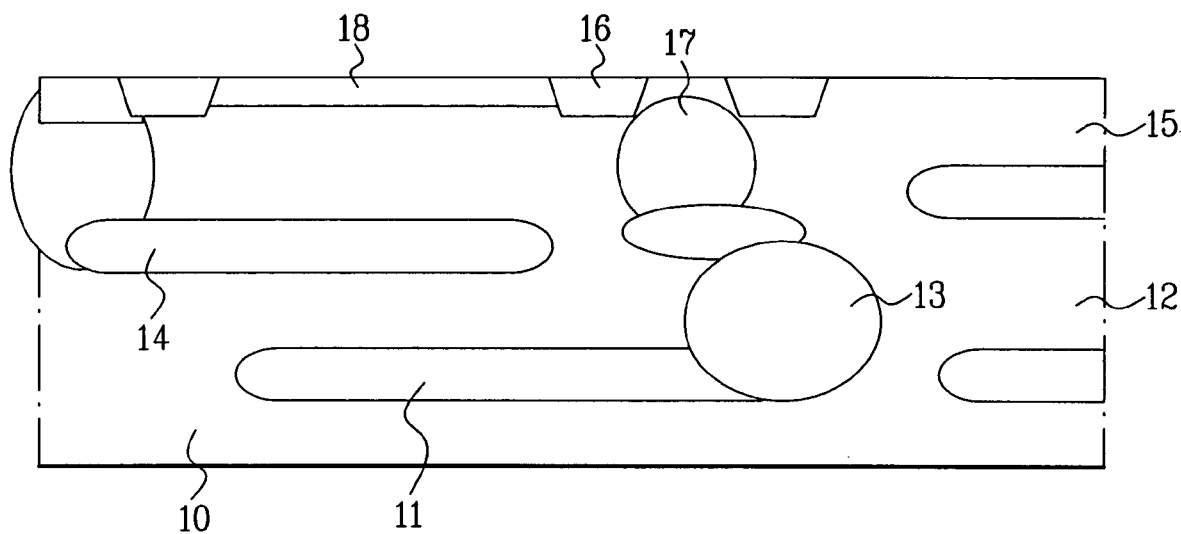
FIG. 1 illustrates a cross sectional view of a method for fabricating a vertical CMOS image sensor according to the related art.

The opening in photoresist pattern 34 may be the same dimension or smaller than the corresponding opening used to form plug 13 in the related art technique depicted in FIG. 1. Thus, it is possible to improve the vertical connectivity of the first plug 35, and to reduce or prevent the lateral diffusion of dopant(s) from the first plug 35, by virtue of the reduced dopant (e.g., phosphorous) dose in plug 35, even when the opening in photoresist pattern 34 is the same dimension as the corresponding opening used to form plug 13 in FIG. 1.

Figure 4:
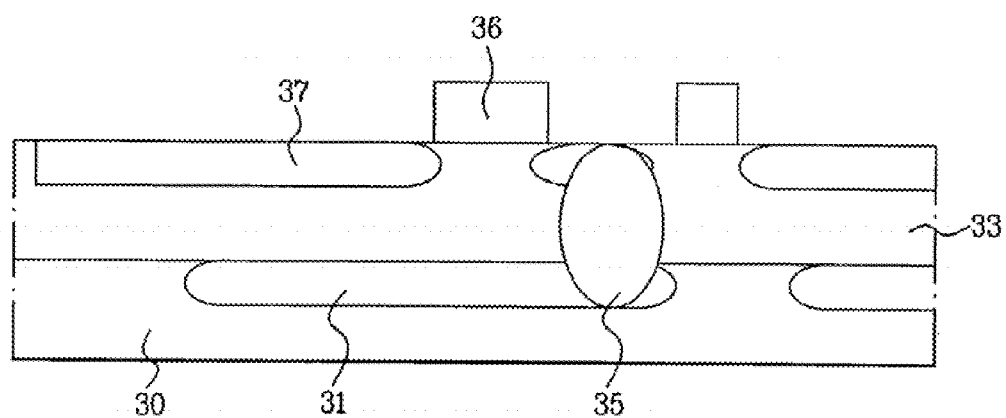

Referring to FIG. 4, a third photoresist is coated after removing the second photoresist pattern 34. Then, a third photoresist pattern 36 is formed by conventional photolithography and development, having an opening in a predetermined portion or area corresponding to a green photodiode. After that, the green photodiode 37 may be formed by implanting ions (e.g., a conventional dose of a conventional dopant for such a photodiode at an energy appropriate for formation of such a photodiode, such as a relatively low energy as described herein) using the third photoresist pattern 36 as a mask, and then the third photoresist pattern 36 is removed.

Figure 5:
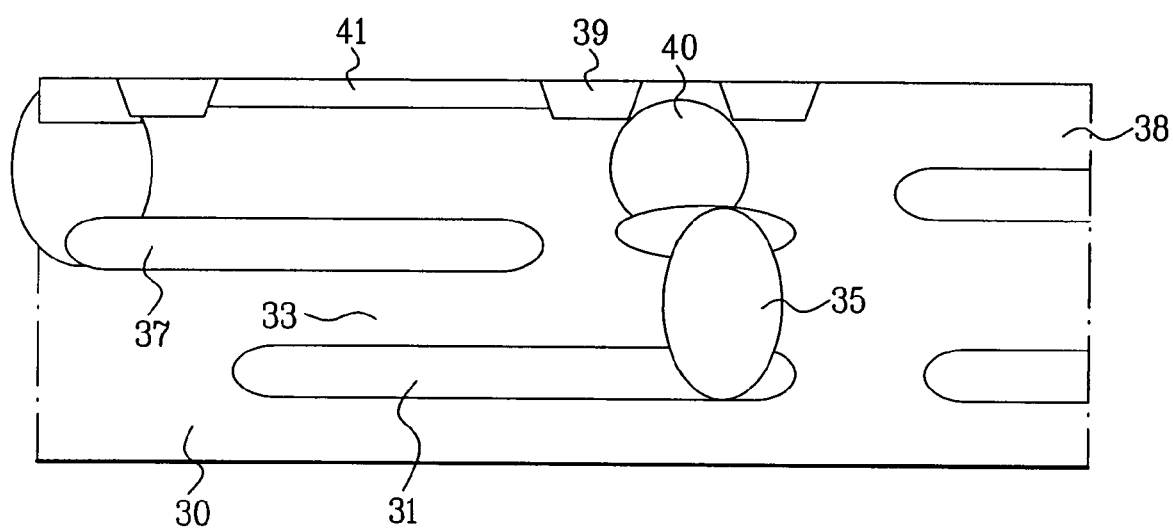

Referring to FIG. 5, a third epitaxial layer 38 is formed (typically by conventional epitaxial growth of silicon or silicon-germanium) on the second epitaxial layer 33 including the green photodiode 37. Then, a conventional STI (Shallow Trench Isolation) process is performed to partially etch the third epitaxial layer 38 and to form an insulating layer (such as silicon dioxide) therein, typically by wet and/or dry thermal oxidation (e.g., to form a liner oxide in the STI trench) and/or conventional chemical vapor deposition (which may be plasma-enhanced and/or plasma-assisted) of a bulk silicon oxide to fill the trench, followed by chemical mechanical polishing and/or etchback to remove the oxide from areas other than the trench, thereby forming an isolation area 39.

After that, a fourth photoresist pattern is formed on the third epitaxial layer 38 including the isolation area 39. Also, a second plug 40 may be formed to provide an electrical connection with the green photodiode 37 by conventional ion implantation (e.g., a medium-to-heavy dose of phosphorous and/or arsenic at one or more energies appropriate for formation of an implant plug 40 through the third epitaxial layer 38). After removing the fourth photoresist pattern, a fifth photoresist pattern is formed on the third epitaxial layer 38, and a blue photodiode 41 is formed by ion implantation (e.g., using a conventional dose of a conventional dopant for such a photodiode at an energy appropriate for formation of such a photodiode, such as a relatively low energy as described herein). Alternatively, instead of the red, green and blue photodiodes described herein, a vertical photosensor including magenta, yellow, and cyan photodiodes may be employed.

Figure 6:
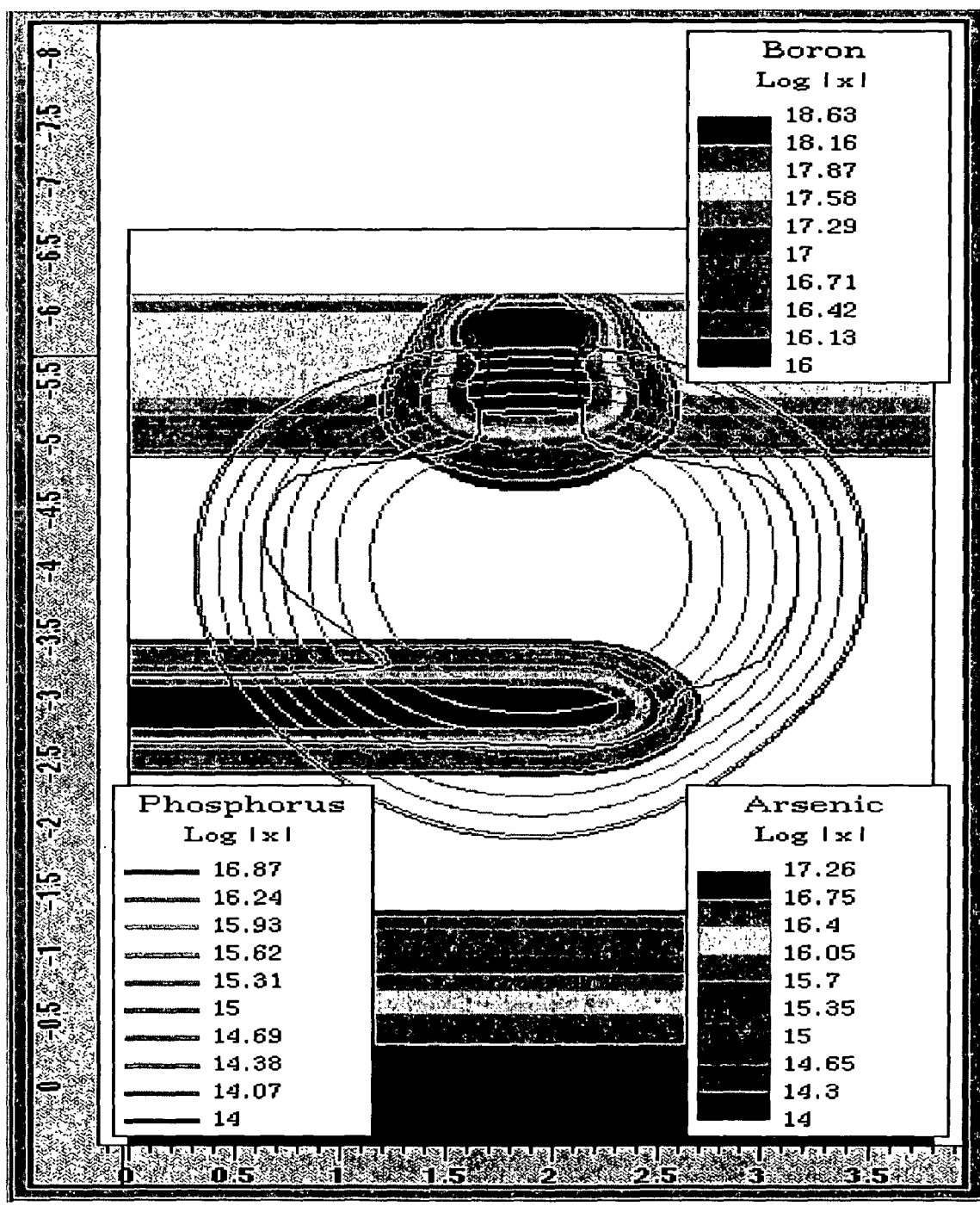
FIGS. 6 and 7 illustrate two-dimensional simulation results from comparing the junction characteristics in vertical CMOS image sensors according to the related art and the present invention.
Figure 7:
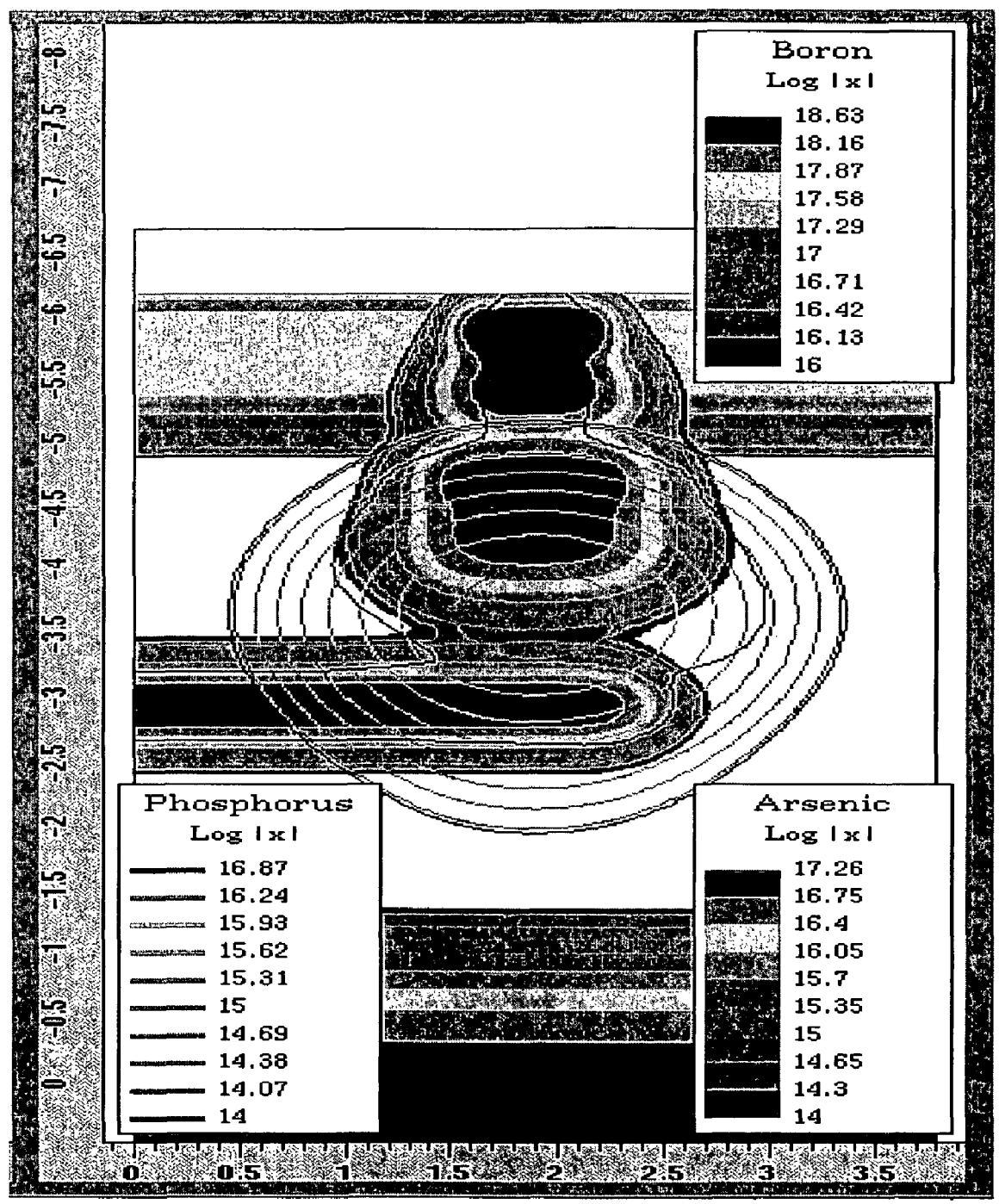

FIGS. 6 and 7 illustrate two-dimensional simulation results, comparing the junction characteristics in vertical CMOS image sensors according to the related art and the present invention.

In the vertical CMOS image sensor according to the related art (FIG. 6), lateral diffusion is widely generated. Meanwhile, in case of the vertical CMOS image sensor according to the present invention (FIG. 7), it is possible to reduce or prevent such lateral diffusion without problems in the vertical characteristics according to the two-dimensional profile, even when the implant plug is formed in the same area (e.g., through a photoresist opening of the same dimension) in both approaches. Thus, it is possible to improve the isolation characteristics by obtaining a sufficient interval between adjacent photodiodes. That is, in the vertical CMOS image sensor according to the present invention, the isolation characteristics of the first plug 35 are improved with respect to the diffusion characteristics of phosphorous and/or arsenic, thereby improving the integration of the image sensor by decreasing the size of unit pixel.

As mentioned above, the method for fabricating the vertical CMOS image sensor according to the present invention has the following advantages.

In the method for fabricating the vertical CMOS image sensor according to the present invention, to form a plug for sensing the signal of a photodiode, phosphorous and/or arsenic ions are implanted while controlling the dopant dose and energy. Thus, it is possible to improve the isolation characteristics between adjacent photodiodes by reducing or minimizing the lateral diffusion of the dopant(s) in the plug. As a result, it is possible to decrease the size of the unit pixel and improve integration in vertical CMOS image sensors according to the present invention.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a vertical CMOS image sensor comprising:
    forming a first photodiode in a semiconductor substrate;
    forming a first epitaxial layer on the semiconductor substrate including the first photodiode;
    forming a first plug by sequentially implanting phosphorous ions at a first dosage and a first implantation energy and arsenic ions at a second dosage and a second implantation energy in the first epitaxial layer, wherein the second dosage is greater than the first dosage, and the first implantation energy is greater than the second implantation energy;
    forming a second photodiode in the first epitaxial layer;
    forming a second epitaxial layer on the first epitaxial layer including the second photodiode;
    forming an isolation area in the second epitaxial layer; and
    forming a third photodiode and a second plug in the second epitaxial layer.

2. The method as claimed in claim 1, wherein the phosphorous ions are implanted at an energy from 1200 keV to 1800 keV.

3. The method as claimed in claim 2, wherein the phosphorous ions are implanted at an energy of 1500 keV.

4. The method as claimed in claim 1, wherein the arsenic ions are implanted at an energy from 1000 keV to 1500 keV.

5. The method as claimed in claim 4, wherein the arsenic ions are implanted at an energy of 1200 keV.

6. The method as claimed in claim 1, wherein the process of forming the first plug includes:
    forming a photoresist pattern defining an area of the first plug in the first epitaxial layer;
    implanting the phosphorous ions into the first epitaxial layer using the photoresist pattern as a mask;
    implanting the arsenic ions into the first epitaxial layer using the photoresist pattern as a mask; and
    implanting second arsenic ions into the first epitaxial layer using the photoresist pattern as a mask.

7. The method as claimed in claim 6, wherein the phosphorous ions are implanted at an energy from 1200 keV to 1800 keV.

8. The method as claimed in claim 7, wherein the phosphorous ions are implanted at an energy of 1500 keV.

9. The method as claimed in claim 6, wherein the arsenic ions are implanted at an energy from 1000 keV to 1500 keV.

10. The method as claimed in claim 9, wherein the arsenic ions are implanted at an energy of 1200 keV.

11. The method as claimed in claim 6, wherein the second arsenic ions are implanted at an energy from 400 keV to 800 keV.

12. The method as claimed in claim 11, wherein the second arsenic ions are implanted at an energy of 500 keV.

13. The method as claimed in claim 1, wherein forming the first plug includes forming a photoresist pattern defining an area of the first plug in the first epitaxial layer.

14. The method as claimed in claim 13, wherein the phosphorous ions and the arsenic ions are implanted through the photoresist pattern defining the area of the first plug in the first epitaxial layer.

15. The method as claimed in claim 1, wherein the first dosage is from about $5 \times 10^{12}$ to about $1 \times 10^{13}$ atoms/cm$^2$ and the second dosage is from about $5 \times 10^{12}$ to about $5 \times 10^{13}$ atoms/cm$^2$.

16. A method for fabricating a vertical CMOS image sensor comprising:
    forming a first plug in a first epitaxial layer on a semiconductor substrate having a first photodiode therein, by implanting phosphorous ions at a low dose and at a first implantation energy, and implanting arsenic ions at a higher dose and at a second implantation energy, in the first epitaxial layer, wherein the first implantation energy is higher than the second implantation energy;
    forming a second photodiode in the first epitaxial layer;
    forming a second epitaxial layer on the first epitaxial layer; and
    forming a third photodiode and a second plug in the second epitaxial layer.

17. The method as claimed in claim 16, wherein the first implantation energy is from about 1000 keV to about 2000 keV.

18. The method as claimed in claim 16, wherein the first implantation energy is about 1500 keV.

19. The method as claimed in claim 16, wherein the second implantation energy is from about 1000 keV of about 1500 keV.

20. The method as claimed in claim 16, wherein the second implantation energy is about 1200 keV.

21. The method as claimed in claim 16, further comprising implanting third ions at a third implantation energy.

22. The method as claimed in claim 21, wherein the third ions comprise arsenic ions.

23. The method as claimed in claim 21, wherein the third ions are implanted at a dose from about $7 \times 10^{12}$ to about $8 \times 10^{12}$ atoms/cm$^2$.

24. The method as claimed in claim 21, wherein the third ions are implanted at a third implantation energy of from about 300 to about 1000 keV.

25. The method as claimed in claim 21, wherein the third ions are implanted at a third implantation energy of from about 400 to about 800 keV.

26. The method as claimed in claim 16, wherein the low dose of the phosphorous ions is from about $5 \times 10^{12}$ to about $1 \times 10^{13}$ atoms/cm$^2$.

27. The method as claimed in claim 16 wherein the high dose of the arsenic ions is from about $5 \times 10^{12}$ to about $5 \times 10^{13}$ atoms/cm$^2$.

28. The method as claimed in claim 16, wherein the high dose of the arsenic ions is from about $7 \times 10^{12}$ to about $8 \times 10^{12}$ atoms/cm$^2$.

29. The method as claimed in claim 16, wherein the phosphorus ions and the arsenic ions are implanted through a photoresist pattern defining an area of the first plug in the first epitaxial layer.

\* \* \* \* \*